United States Patent [19]

Suyama

[11] Patent Number: 5,031,153
[45] Date of Patent: Jul. 9, 1991

[54] MOS SEMICONDUCTOR MEMORY DEVICE HAVING SENSE CONTROL CIRCUITRY SIMPLIFIED

[75] Inventor: Junichi Suyama, Tokyo, Japan

[73] Assignee: Oki Electric Industry Co., Ltd., Japan

[21] Appl. No.: 449,562

[22] Filed: Dec. 12, 1989

[30] Foreign Application Priority Data

Dec. 13, 1988 [JP] Japan .................. 63-314357

[51] Int. Cl.⁵ .................................. G11C 11/34
[52] U.S. Cl. ............................. 365/206; 365/210
[58] Field of Search ............... 365/149, 206, 210, 208

[56] References Cited

U.S. PATENT DOCUMENTS 4,086,662  4/1978  Itoh ........................... 365/149 X
4,622,655  11/1986  Suzuki ........................ 365/149
4,791,616  12/1988  Taguchi et al. ................ 365/208 X Primary Examiner—Joseph A. Popek
Attorney, Agent, or Firm—Edward D. Manzo

[57] ABSTRACT

An MOS semiconductor memory device includes memory cell matrices. Each matrix is constituted with memory cells and noise cancellers. Each memory cell is connected, at an intersection between a pair of bit lines and a word line, between either one of the bit lines and the word line. The word line controls read and write operations of the memory cell. The noise canceller is connected, at an intersection between a pair of bit lines and a dummy word line, between either one of the bit lines and the dummy word line. The dummy word line enables the noise canceller. The memory cell matrices form groups of memory cells into which the cells are grouped in accordance wtih addresses. The dummy word line and the word line have substantially identical characteristics. The dummy word line possesses parasitic resistance and capacitance to delay by a first predetermined period of time a signal to enable the noise canceller. The memory device further includes sense amplifier circuits connected between the pair of bit lines of the memory cell matrices for amplifying a potential difference between the bit lines in response to an enable signal, and a sense control circuit connected to the dummy word lines and the sense amplifier circuits to be operative in a read or write operation of the memory cell for selectively enabling related sense amplifier circuits in response to a signal delayed by a dummy word line of selected ones of the memory cell matrices.

20 Claims, 8 Drawing Sheets

MOS SEMICONDUCTOR MEMORY DEVICE HAVING SENSE CONTROL CIRCUITRY SIMPLIFIED

BACKGROUND OF THE INVENTION

1. Field of the Invention

The present invention relates to an MOS semiconductor memory device, more specifically, to a semiconductor memory device such as a dynamic random access memory. RAM, having a plurality of memory cell matrices and a sense control for controlling operations of sense amplifiers connected to the matrices.

2. Description of the Prior Art

Some conventional types of MOS semiconductor memory devices include a plurality of memory cell matrices arranged with associated sense amplifiers and sense controls provided. In such types of device, since each memory cell matrix has a sense control provided exclusively, the number of constituent elements and hence that of wirings therebetween are increased, which has been a hindrance to designing highly integrated memory devices.

Heretofore, there has been an MOS semiconductor memory device of the type shown in FIGS. 2A and 2B, for example. A description will be given of the constitution of the device with reference to those figures, which illustratively show schematic configurations of the conventional MOS semiconductor memry device.

The illustrative device is a dynamic RAM including memory cell matrices 10-1 to 10-4 into which memory cells are grouped in accordance with row and column addresses. Each of the memory cell matrices 10-1 to 10-4 comprises a plurality of memory cells 13 of a single-transistor type connected to word lines 11 and to pairs of bit lines 12a and 12b, and a plurality of noise cancellers 15 each including an MOS tansistor connected to a dummy word line 14 and a pair of bit lines 12a and 12b.

In the proximity of the memory cell matrices 10-1 to 10-4, there are disposed in association therewith row address decoders 20-1 to 20-4, word line drives 21-1 to 21-4, and noise canceller controls 22-1 to 22-4, respectively. The drives and controls are connected to the associated decoders. For the work line drives 21-1 to 21-4 and the noise canceller controls 22-1 to 22-4, the voltages thereof are increased by use of a word line votage step-up or booster circuit 23. The word line drives 21-1 to 21-4 are connected to the respective memory cell matrices 10-1 to 10-4, whereas the noise canceller controls 22-1 to 22-4 are linked to the dummy word lines 14.

Connected between the bit lines 12a and 12b is an n-channel type of sense amplifier 24 and a p-channel type of sense amplifier 25. Those sense amplifiers 24 and 25 are respectively connected via associated enable signal lines 26 and 27, an n-channel type of MOS transistor 29 to sense controls 30-1 to 30-6. The sense controls 31-1 to 31-6 are respectively selected in response to address signals Al, ..., Ai, ..., Aj, ..., and An; specifically, based on the signals $\overline{Ai}$ and Aj and inverted signals thereof Ai and $\overline{Aj}$. These controls are connected in common via a word line monitor curcuit 31 to the word line booster circuit 23.

In FIGS. 2A and 2B, lines 30S and $\overline{30S}$ are complementary outputs from the sense controls 30-1 to 30-6, Vcc indicates a power supply voltage, and Vcp denotes a reference voltage which is equal to Vcc/2.

FIGS. 3A to 3G plot operative waveforms appearing in the system of FIGS. 2A and 2B. Referring to those waveforms, operations of the circuitry shown in FIGS. 2A and 2B will be described. In a memory cell matrix, 10-1, for example, selected based on address signals A1 to An, the word line drive 21-1 is supplied with outputs from the word line booster circuit 23 and the row address decoder 20-1 to resultantly produce an output. Based on the output, a word line 11 is selected to be set to its high level "H". In this situation, on the all bit lines connected to the all memory cells 13 linked to the word line 11, namely, the selected bit lines 12a, noises appear because of coupling of word line 11 caused by parasitic capacitance. In order to suppress the noises, the noise canceller control 22-1 receiving the outputs from the row address decoder 20-1 and the word line booster 23 produces an output to set the dummy word line 14 to its low level "L". In response thereto, the noise canceller 15 is enabled. The bit lines 12b not connected to any memory cell 13 is called unselected bit lines.

If information stored in a memory cell 13 is a logical "1", for example, when the word line 11 carries a potential level not less than the sum of reference potential Vcp and NMOS threshold potential VTN, a potential difference $\Delta V$ (= |selected bit line 12a potential − unselected bit line 12b potential|) appears between the selected bit lines 12a and 12b. If information stored in the memory cell 13 is a logical "0", the potential difference is developed when the level of the word line 11 becomes at least the voltage VTN.

In order for the potential difference $\Delta V$ to be fully developed, the word line monitor 31 receiving the output from the word line booster 23 supplies an output with a predetermined delay time to a sense control, 30-2 in this example, associated with the selected memory cell matrix 10-1. The sense control 30-2 is beforehand selected in response to the address signals AiAj to $\overline{AiAj}$. The sense control 30-2 supplied with the output from the word line monitor 31 sets one output 30S therefrom to its high level "H" and the other output $\overline{30S}$ to its low level "L". When the ouptut 30S is thus set to the high level, the MNOS 28 turns on and hence the enable signal line 26 goes down to its low level "L", which is identical to a ground potential. When the output $\overline{30S}$ is thus lowered, the PMOS 29 turns on to set the enable signal line 27 to its high level "H", which is equal to the power supply potential Vcc. Consequently, the n-channel type of sense amplifier 24 and the p-channel type of sense amplifier 25 start their operations. This initiates charge and discharge operations of the paired bit lines 12a and 12b. When the levels of the bit lines 12a and 12b are resultantly settled, the sense operation is completed.

Information signals on the bit lines 12a and 12b are passed via a transfer gate, not shown, which turns on and off in response to an output from a row address decoder, so as to be read out to an external device over a line such as a data bus.

However, in the apparatus configured as above, since the exclusive sense controls 30-1 to 30-6 are respectively required for the memory cell matrix pairs 10-1 and 10-2 as well as 10-3 and 10-4, the number of circuit constituent elements and hence the number of wirings therebetween are increased, which is not suitable for a high integration of the device. In addition, solutions of these problems have been attended with difficulties.

SUMMARY OF THE INVENTION

It is therefore an object of the present invention to provide an MOS semiconductor memory device in which the number of circuit constituent elements and the number of wirings are decreased.

In accordance with the present invention, there is provided an MOS semiconductor memory device comprising a plurality of memory cell matrices each comprising memory cells and noise cancellers. Each of said memory cell is connected, at an intersection between a pair of bit lines and a word line, between either one of the bit lines and the word line. The word line controls read and write operations of the memory cell. The noise canceller is connected, at an intersection between a pair of bit lines and a dummy word line, between either one of the bit lines and the dummy word line. The dummy word line enables the noise canceller. The memory cell matrices are grouped into groups of memory cells arranged in association with addresses. The dummy word line and the word line have substantially identical characteristics. The dummy word line possesses parasitic resistance and capacitance to delay by a first predetermined period of time a signal enabling said noise canceller. The memory device further includes a corresponding plurality of sense amplifier circuits connected between the pair of bit lines of said memory cell matrices for amplifying a potential difference between the bit lines in response to an enable signal. Included in the memory device is a sense control circuit connected to said dummy word lines and said sense amplifier circuits. The circuits are operative in read-out or write-in of the memory cell for selectively enabling related ones of said sense amplifier circuits in response to a signal delayed by a dummy word line of selected one of said memory cell matrices.

In accordance with the present invention, the sense control is responsive in a write or read mode to a delay signal of the dummy word line associated with a pair of memory cell matrices for selecting an enable signal of either one of the pair of matrices.

Also in accordance with the present invention, a switch circuit of the sense control generates a selection signal in response to a delay signal on the dummy word line so as to enable an enable signal line for which a sense clock drive is selected.

BRIEF DESCRIPTION OF THE DRAWINGS

The objects and features of the present invention will become more apparent from the consideration of the following detailed description taken in conjunction with the accompanying drawings in which:

FIGS. 5A through 5K plot signal waveforms appearing in circuit components of the embodiment shown in FIGS. 1A, 1B and 1C.

DESCRIPTION OF THE PREFERRED EMBODIMENT

Figure 1A:
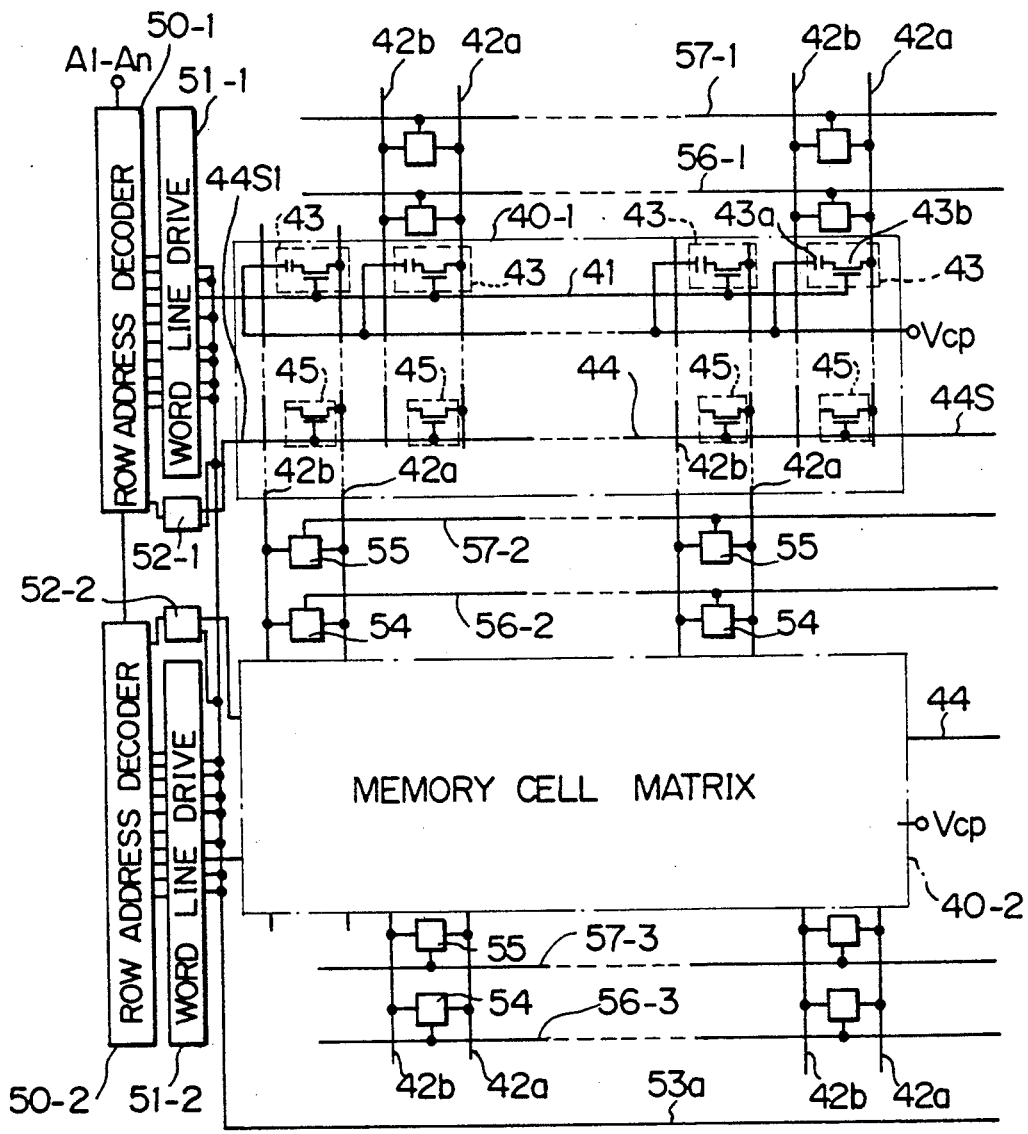
FIGS. 1A, 1B and 1C are diagrams schematically showing a preferred embodiment of an MOS semiconductor memory device in accordance with the present invention.
Figure 1B:
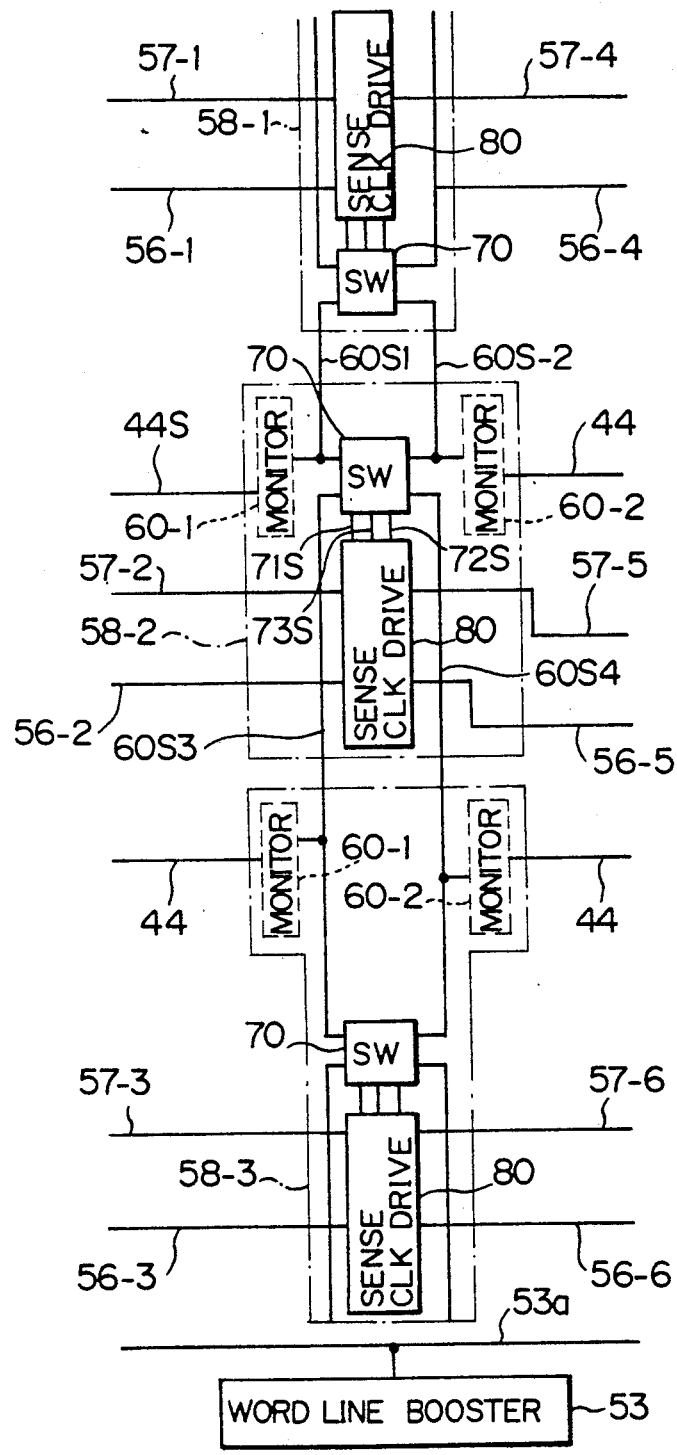
Figure 1C:
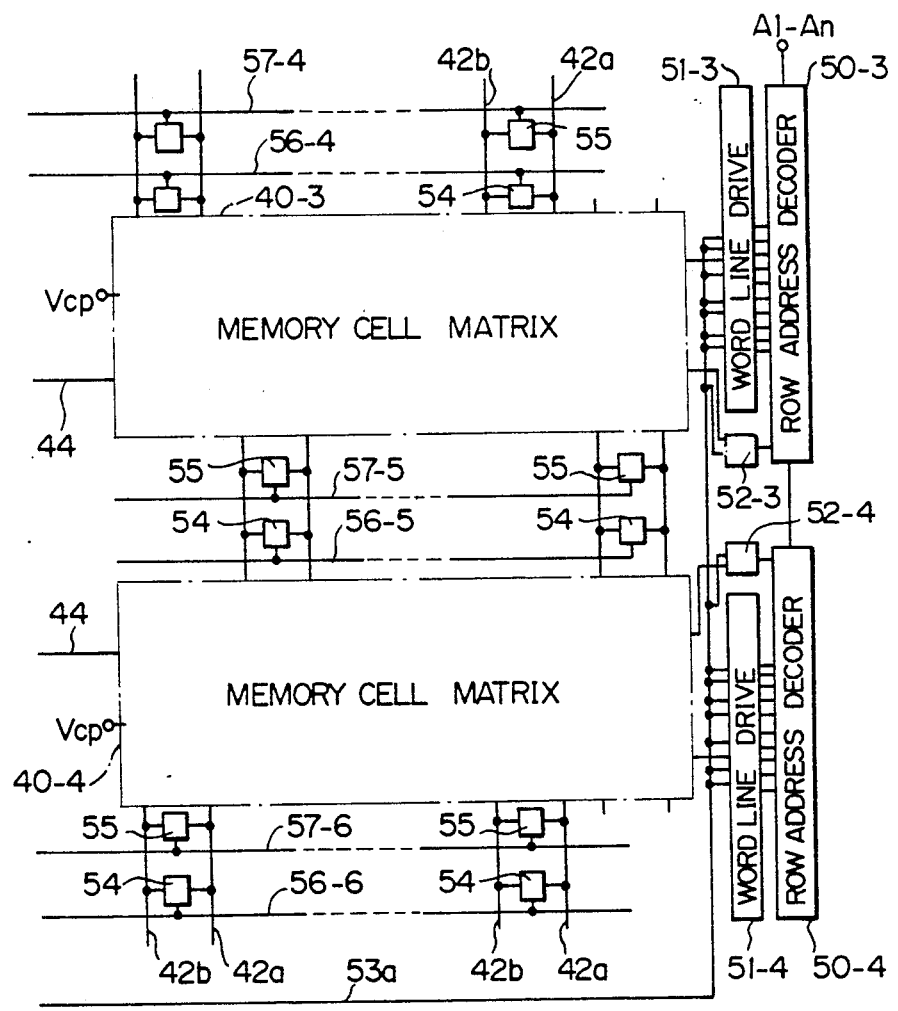
Figure 2A:
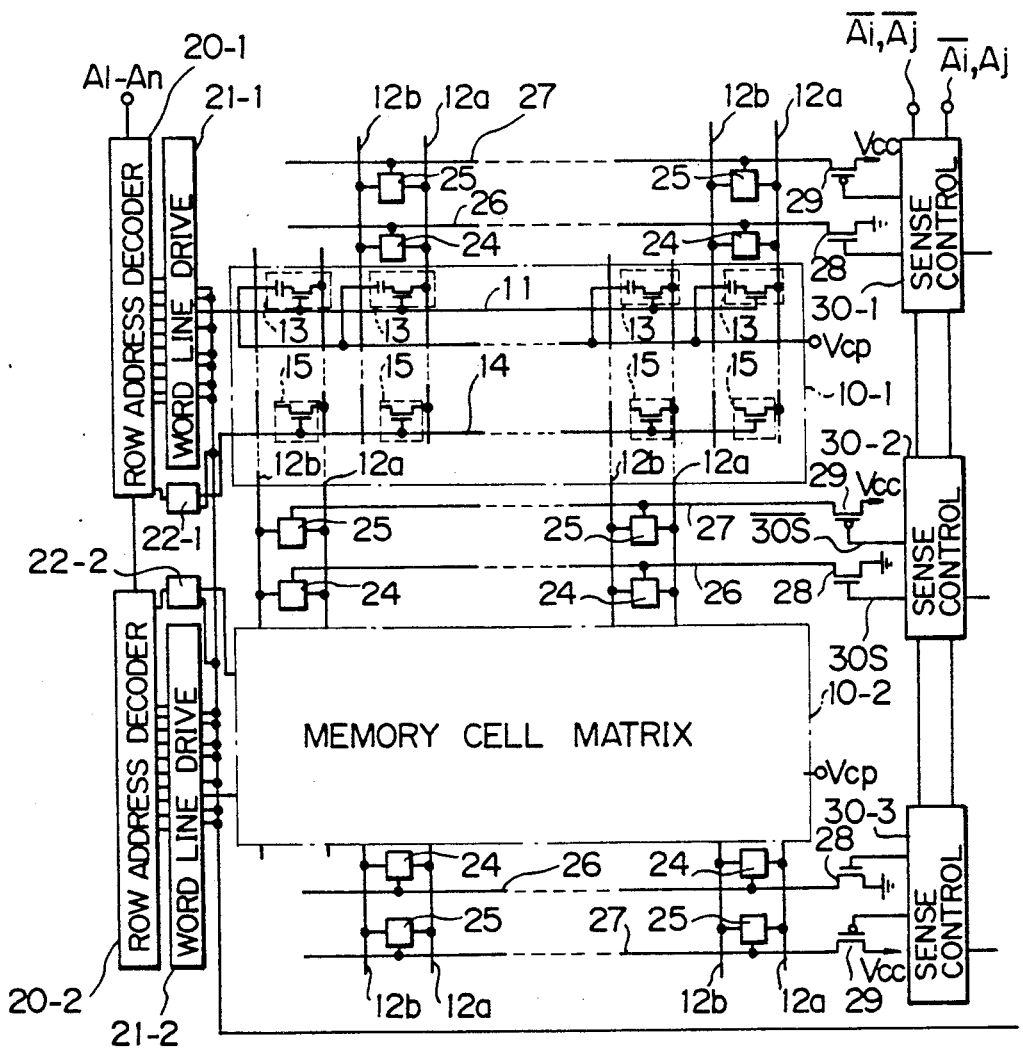
FIGS. 2A and 2B schematially show an example of the MOS semiconductor memory device of the prior art.
Figure 2B:
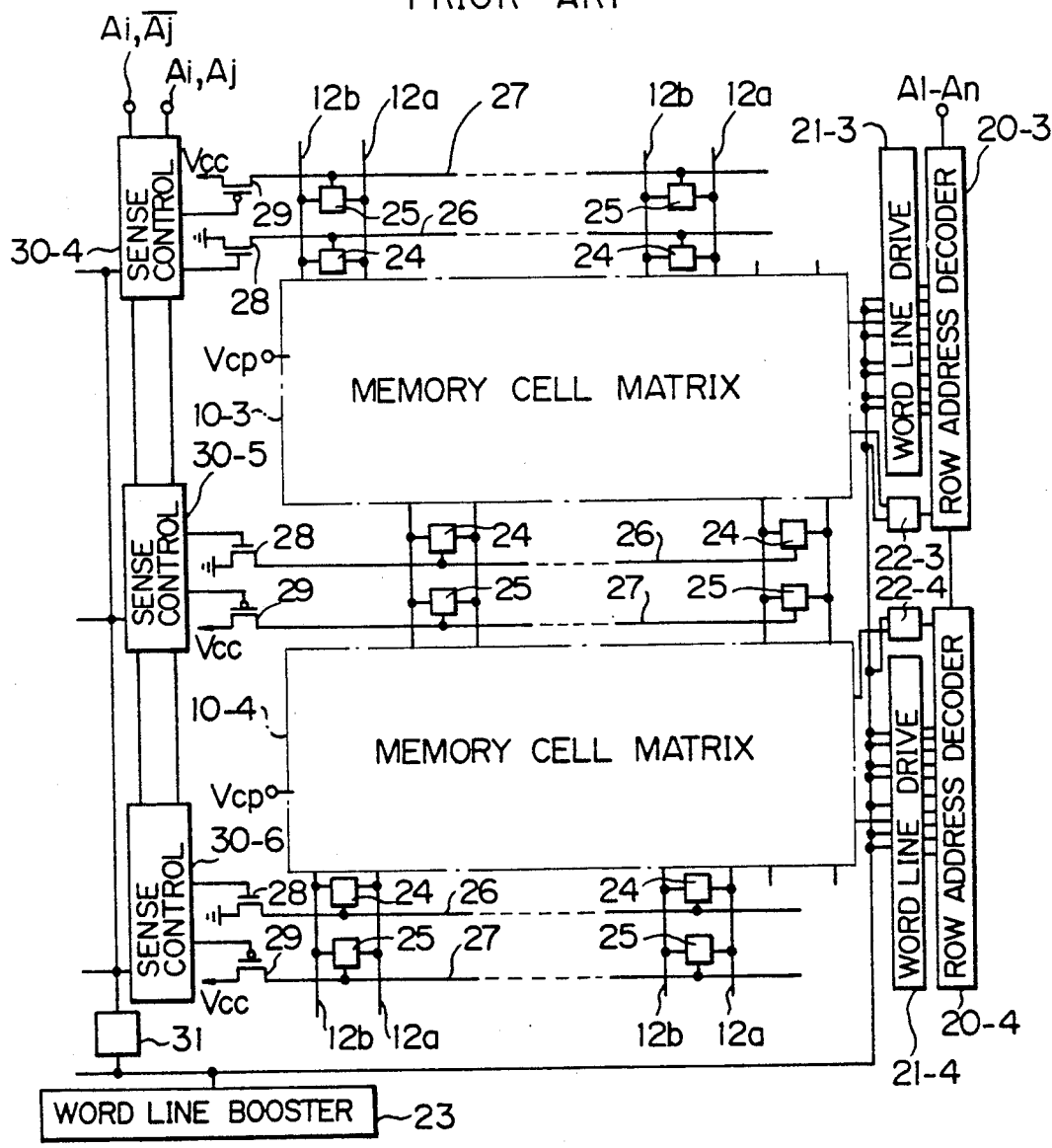
Figure 3A:
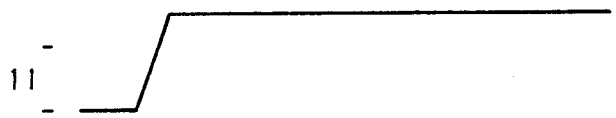
FIGS. 3A through 3G plot signal waveforms developed in parts of the circuitry shown in FIGS. 2A and 2B.
Figure 3B:
Figure 3C:
Figure 3D:
Figure 3E:
Figure 3F:
Figure 3G:
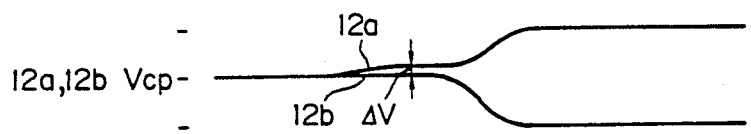

The MOS semiconductor memory device shown in FIGS. 1A, 1B and 1C is a dynamic RAM including CMOS transistors. The RAM comprises a plurality of memory cell matrices 40-1 through 40-4 each comprising a plurality of memory cells 43 arranged in association with row and column addresses. Although four matrices 40-1 to 40-4 are disposed in this embodiment, this is shown only by way of example. The numbers of constituent components such as circuit elements and wirings may arbitrarily be selected in accordance with the device design.

The memory cell matrices 40-1 to 40-4 each include a plurality of memory cells 43 of a sole-transistor type constituted with an MOS capacitance 43a and an NMOS transistor 43b connected to a metallic word line 41 and a pair of bit lines 42a and 42b, and a plurality of noise cancellers 45 connected to a dummy word line 44 and a pair of bit lines 42a and 42b, as shown in the figures. The MOS capacitance 43a is coupled to a reference potential Vcp, which is half the power source potential Vcc. The dummy word lines 44 and the word lines 41 may be formed with substantially the same metal material and contour to delay a signal by a predetermined period of time by use of a resistive delay caused by parasitic resistance and capcitance thereof. The noise canceller 45 includes an NMOS transistor having a structure substantially identical to that of the NMOS transistor, in the memory cell 43. The NMOS transistor of the noise canceller 45 has a gate electrode and a drain electrode respectively connected to the dummy word line 44 and the bit line 42a. The NMOS transistor possesses a source electrode, which may be open or may be interconnected to the bit line 42b.

In the proximity of the memory cell matrices 40-1 to 40-4, row address decoders 50-1 to 50-4 to decode address signals A1 to An are disposed in association therewith. Moreover, word line drives 51-1 to 51-4 and noise canceller controls 52-1 to 52-4 are connected to the decoders 50-1 to 50-4, respectively. The drives 51-1 to 51-4 and controls 52-1 to 52-4 are connected to an output 53a from a word line booster circuit 53, which increases the votages supplied thereto. The drives 51-1 to 51-4 and the controls 52-1 to 52-4 are respectively connected to the word lines of the associated memory cell matrices 40-1 to 40-4 and to the dummy lines 44.

Connected between the paired bit lines 42a and 42b are an n-channel type of sense amplifier 54 and a p-channel type of sense amplifier 55. The amplifiers 54 and 55 are linked via pairs of enable signal lines 56-1 to 56-6 and 57-1 to 57-6 to sense controls 58-1 to 58-3, respectively, as shown in the figures.

Figure 4:
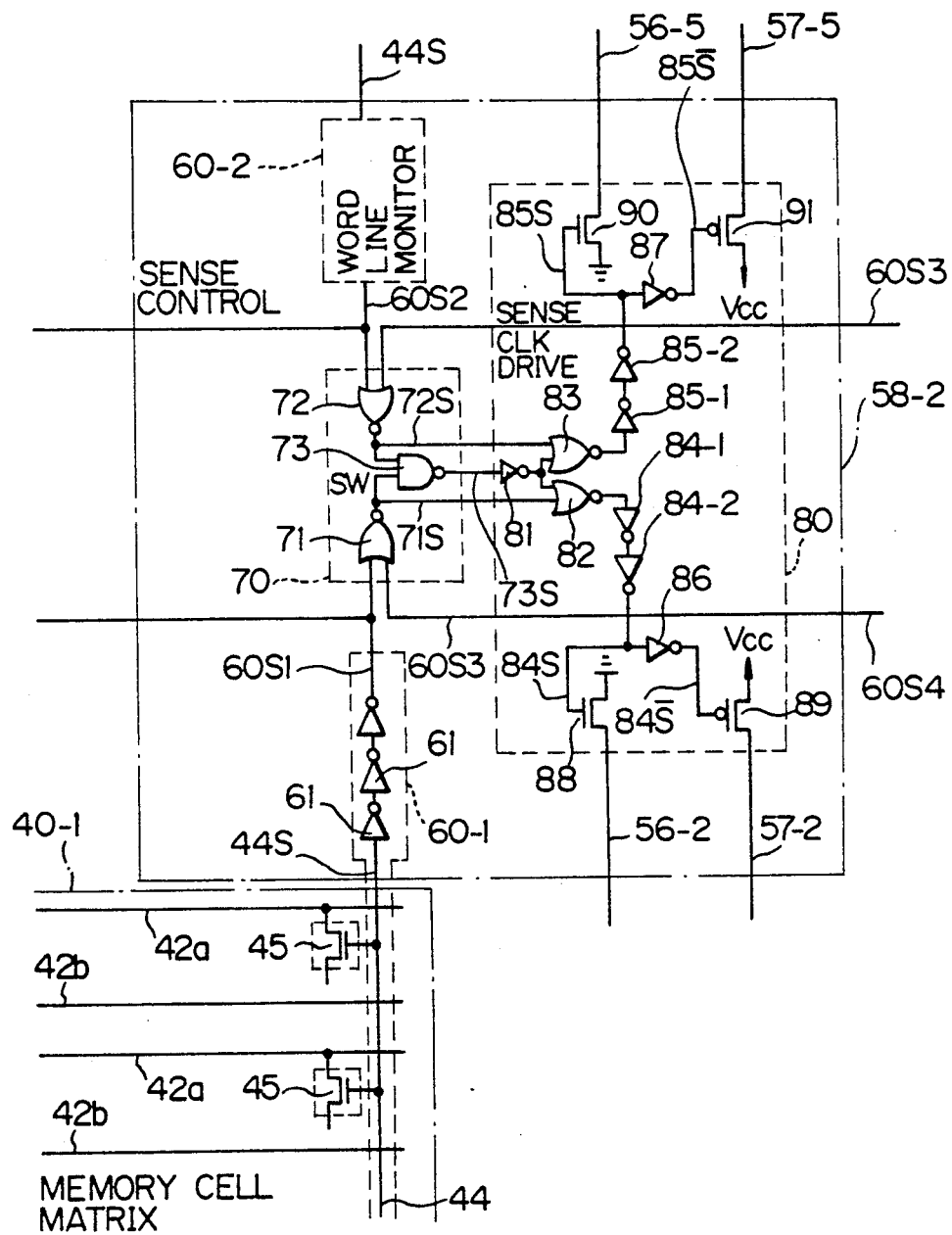
FIG. 4 is a schematic diagram showing a configuration example of a sense control in the embodiment shown in FIGS. 1A to 1C.
Figure 5A:
Figure 5B:
Figure 5C:
Figure 5D:
Figure 5E:
Figure 5F:
Figure 5G:
Figure 5H:
Figure 5J:
Figure 5K:
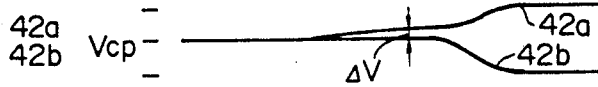

The controls 58-1 to 58-3 are mutually of the same circuit constitution. FIG. 4 shows the sense control 58-2 for use of explanation. This component 58-2 includes two word line monitors 60-1 and 60-2, a switch 70, and a sense clock drive 80. The monitors 60-1 and 60-2 delay by a predetermined period of time a signal 44 from the dummy word line 44 associated with paired memory cell arrays 40-1 and 40-3. Each monitor includes inverters 61 interconnected in cascades. The switch 70 is responsive to outputs 60S1 and 60S2 from the associated word line pair 60-1 and 60-2 and to outputs 60S3 and 60S4 resepctively from the monitors 60-1 and 60-2 of the adjacent sense control 58-3 for selecting the enable signal lines 56-2 and 57-2 or 56-5 and 57-5. The switch is a logic circuit comprising two-input NOR gates 71 and 72 and a two-input NAND gate 73.

The sense clock drive 80 is responsive to outputs 71S and 72S respectively from the NOR gates 71 and 72 and to an output 73S from the NAND gate 73 for enabling either one of enable line pairs 56-2 and 57-2 or 56-5 and 57-5. The drive 80 includes a signal selecting subsection comprising an inverter 81 and two-input NOR gates 82 and 83. Linked to an output port thereof are inverters 84-1, 84-2 and 85-1, 85-2 connected in cascades as shown in the figure. The inverter 84-2 produces an output 84S, which is on one hand supplied via an NMOS 88 to the enable signal line 56-2 and is on the other hand inverted by an inverter 86 to be an output $\overline{84S}$. This output $\overline{84S}$ is fed via a PMOS 89 to the enable signal line 57-2. Similarly, the inverter 85-2 generates an output 85S, which is on one hand delivered via an NMOS 90 to the enable signal line 56-5 and is on the other hand inverted through an inverter 87 to be an output $\overline{85S}$. This output $\overline{85S}$ is supplied via a PMOS 91 to the enable signal line 57-5.

Referring to FIGS. 5A to 5K, a description will be given to the operations of the illustrative embodiment. In the description and figures, signals are indicated with reference numerals of lines carrying the signals. On receiving the address signals A1 to An, the row address decoders 50-1 to 50-4 decode those signals to select depending on results of the decoding one of the drives 51-1 to 51-4 and one of controls 52-1 to 52-4, for example, the drive 51-1 and the control 52-1, so as to determine the memory cell matrix 40-1 to be accessed. In the selected matrix 40-1, when outputs respectively from the word line booster 53 and the row address decoder 50-1 are supplied to the drive 51-1 and the control 52-1, the drive 51-1 selects one of the word lines 41 to set the selected line 41 to its high level "H". In this situation, unless the noise canceller 45 is enabled, there would appear noises in the selected bit lines 42a linked to the memory cell 43 due to a capacitive coupling with the word line 41. In this embodiment, however, in order to suppress the noises, the selected noise canceller control 52-1 produces an output to set the dummy word line 44 to its low level "L". As a result, the noise canceller 45 starts its operation to suppress the noise on the word line 41.

In a case where information stored in the memory cell 43 connected to the selected word line 41 indicates a logical "1", if the word line 41 is set to a level not below the sum of reference potential Vcp and NMOS threshold voltage VTN, the NMOS 43b in the memory cell 43 turns on. Resultantly, electric charge stored in the MOS capacitance 43 causes a slight potential difference ΔV to appear between the bit lines 42a and 42b. If the information stored in the memory cell 43 is logical "0", the slight potential difference ΔV is developed when the word line 41 is set to a level not below the NMOS threshold voltage VTN. The potential difference ΔV thus developed is amplified by the enabled sense amplifiers 54 and 55 to amplify the potential of the bit line 42a toward the level "H" to the power source potential Vcc, and that of the bit line 42b toward the level "L" to the ground potential.

However, when the potential difference ΔV is too small, the sense amplifiers 54 and 55 might conduct wrong operations. To overcome this difficulty, in accordance with this embodiment, the sense amplifiers 54 and 55 are enabled after a predetermined period of time is elapsed so as to establish a sufficient potential difference. More specifically, the output from the control 52-1 is delayed by a predetermined period of time by means of a resistive delay due to the parasitic resistance and capacitance of the dummy word line 44. Moreover, a resultant signal 44S thus delayed is further delayed by a word line monitor 70 in the selected control 58-2 to guarantee a wait time to be elapsed before the sense amplifiers 54 and 55 are enabled.

When the output 60S1 from the selected monitor 61 is set to its high level "H", the output 60S1 enables the NOR gate 71 in the switch 70. In this operation, the monitor outputs 60S2 to 60S4 respectively associated with unselected matrices 40-2 to 40-4 are retained at its low level "L". When the output "H" from the monitor 61 enables the NOR gate 71 in the switch 60, the NOR gate 71 lowers its output 71S to its low level "L". The other NOR gate 72 keeps its output 72S at the "H" level. Consequently, the NAND gate 73 sets the output 73S to its high level "H". The output 73S is inverted through the inverter 81 in the drive 80. A resultant signal is fed via the NOR gate 82 and the inverter 84-1, which causes the output 84S from the inverter 84-2 to a level "H" and the output $\overline{84S}$ from the inverter 86 to its low level "L".

In response to the output 84S at the level "H", the NMOS 88 turns on to set the enable signal line 56-2 on the amplifier 54 side to its low level "L", which is identical to the ground potential. Simultaneously, at the lowering of the output $\overline{84S}$, the PMOS 89 turns on to resultantly set the enable signal line 57-2 on the amplifier 55 side to its high level "H" equal to Vcc. In consequence, the amplifiers 54 and 55 causes charge and discharge operations to start in the paired bit lines 42a and 42b. The slight potential discrepancy therebetween ΔV is amplified in the directions of "H" and "L" levels to settle the bit line levels, thereby completing the sense operation.

In a case where another memory cell matrix is selected in response to the address signals Al to An, it need only be considered that, for example, assuming that the output 60S1 effective in the sense control 58 is replaced with the output 60S3 (60S2 or 60S4), the output 71S (or 72S) and hence the outputs 84S and $\overline{84S}$ (or outputs 85S and $\overline{85S}$) are enabled to accomplish the sense operation in a similar fashion.

Upon completion of the sense operation, information signals on the paired bit lines 42a and 42b are read out via a transfer gate, not shown, turning on and off in response to outputs from a row address decoder so as to be fed over a line such as a data bus to an external device.

In a write operation, signals representing write information are supplied to a pair of bit lines 42a and 42b selected by a rwo address decoder, not shown. The signals are amplified by the sense amplifiers 54 and 55. The resultant signals representing information are written in a memory cell 43, at a desired address, connected to a word line 41 selected by one of the row address decoders 50-1 to 50-4.

This embodiment has the following advantageous features. Since the resistive delay primarily owing to the dummy word line 44 is adopted to guarantee the wait time to be elapsed before the potential difference ΔV is developed, the circuit configuration of the word line monitors 60-1 and 60-2 in the sense controls 58-1 to 58-3 can be simplified, or those monitors 60-1 and 60-2 may possibly be dispensed with. Since the switch 70 is employed for the selection of the paired enable signal lines 56-1 to 56-6 and 57-1 to 57-6, the number of the sense controls 59-1 to 59-3 will be minimized. Furthermore, the simplified circuit structure gives rise to reduction in number circuit constituent elements and wirings therebetween, which further improves the circuit density integrated.

The present invention is not restricted by the illustrative embodiment. For example, the memory cell 43 may be constituted with triple-transistor or quadruple-transistor type of memory cells. The memory device may comprise such transistors other than the CMOS transistor as NMOS and PMOS transistors. The internal configuration of the sense controls 58-1 to 58-3 may include circuits of other types. The number of the memory cell matrices and that of other components may be set to other values. The present invention is also applicable to semiconductor devices other than the dynamic RAM.

As above, in accordance with the present invention, since a sense control is adopted to select a plurality of enable signal lines, the number of sense controls is reduced. This results in a minimization of the circuit constituent elements and wirings therebetween, thereby increasing the circuit integration density.

In accordance with the present invention, the sense control includes at least a switch and a sense clock drive, and hence the sense control structure is simplified and the number of circuit elements is lowered.

While the present invention has been described with reference to the particular illustrative embodiment, it is not to be restricted by the embodiment but only by the appended claims. It is to be appreciated that those skilled in the art can change or modify the embodiment without departing from the scope and spirit of the present invention.

What is claimed is:

1. An MOS semiconductor memory device comprising:
   a plurality of memory cell matrices each comprising memory cells, bit line pairs, word lines, a dummy word line, and noise cancellers;
   each of said memory cells being connected at an intersection between a pair of bit lines and a word line, with either one of the bit lines and the word line to be controllable on read out and write in by the word line;
   each of said noise cancellers being connected at an intersection between the pair of bit lines and a dummy word line, with either one of the bit lines and the dummy word line to be controllable by said dummy word line;
   said plurality of memory cell matrices forming groups of memory cells into which the memory cells are grouped in accordance with addresses;
   said dummy word line having characteristics substantially identical to those of said word line and having parasitic resistance and capacitance to delay by a first predetermined period of time an enable signal enabling said noise canceller;
   a plurality of sense amplifier circuits connected between the pair of bit lines of said plurality of memory cell matrices for amplifying a potential difference between the pair of bit lines in response to the enable signal; and
   a sense control circuit connected to said dummy word lines and said plurality of sense amplifier circuits to be operative in read out or write in of the memory cell for selectively enabling associated ones of said plurality of sense amplifier circuits in response to a signal delayed by the dummy word line of selected one of said plurality of memory cell matrices.

2. A device in accordance with claim 1 wherein said sense control circuit comprises:
   a switching circuit connected to the dummy word lines to be operative in read out or write in of a memory cell for producing a switching signal in response to a signal delayed by the dummy word line of the selected memory matrix; and
   a sense clock drive circuit responsive to the switching signal for enabling said sense amplifier circuits associated with the selected memory matrix.

3. A device in accordance with claim 2 wherein said sense control circuit further comprises a word line monitor circuit connected to the dummy word lines to be operative in read out or write in of a memory cell for delaying by a second predetermined period of time a signal received from the dummy word line of the selected memory cell matrix, thereby supplying said switch circuit with a resultant delayed signal.

4. A device in accordance with claim 3 wherein said word line monitor circuit comprises a plurality of cascaded inverters, which are provided in such a number that a total of said first and second predetermined periods of time exceeds a period of time in which said plurality of sense amplifier circuits appropriately operates in response to the potential difference.

5. A memory in accordance with claim 2 wherein each of said plurality of sense amplifier circuits comprises a plurality of sense amplifiers including MOS transistors of types having mutually complementary channel conductivity, said sense clock drive circuit producing mutually complementary signals to enable said MOS transistors.

6. A device in accordance with claim 1 further comprising:
   word line drive means responsive to a row address for driving a word line; and
   a noise canceller control circuit for enabling the dummy word lines.

7. A device in accordance with claim 1 wherein each of said memory cells comprises an element having an MOS structure, each of said noise cancellers having substantially the same structure as that of said element.

8. A device in accordance with claim 7 wherein said element comprises an NMOS transistor and an MOS capacitance, said MOS capacitance being connected to said NMOS transistor in cascade for storing therein information signals.

9. An MOS semiconductor memory comprising:
   a plurality of word lines;
   a dummy word line;
   a plurality of bit lines, every two of which form a bit line pair;
   a plurality of memory cells coupled to corresponding word lines and corresponding bit lines;
   a plurality of sense amplifier circuits coupled to corresponding bit line pairs for amplifying a potential difference across corresponding bit line pairs in response to a first signal;
   means for providing said dummy word line with a second signal; and
   means operative in response to the second signal on said dummy word line for producing the first signal.

10. A memory in accordance with claim 9 wherein said dummy word line has parasitic resistance and capacitance which are substantially equal to those of each of said plurality of word lines, respectively.

11. A memory in accordance with claim 9, further comprising a plurality of noise cancellers, each of which is coupled to said dummy word line and a respective one of said bit line pairs.

12. A memory in accordance with claim 11 wherein said dummy word line has parasitic resistance and capacitance due to said noise cancellers, the parasitic resistance and capacitance being substantially equal to those of said plurality of word lines, respectively.

13. A memory in accordance with claim 9 wherein said means for producing the first signal comprises a sense control circuit connected to said dummy word line and said plurality of sense amplifier circuits to be operative in read out or write in of the plurality of memory cells for selectively enabling associated ones of said plurality of sense amplifier circuits in response to the second signal.

14. A memory in accordance with claim 13 wherein said sense control circuit comprises:
a switching circuit connected to the dummy word line to be operative in read out or write in of a memory cell for producing a switching signal in response to the second signal; and
a sense clock drive circuit responsive to the switching signal for enabling said sense amplifier circuits.

15. A memory in accordance with claim 14 wherein said sense control circuit further comprises a word line monitor circuit connected to the dummy word line to be operative in read out or write in of a memory cell for delaying by a second predetermined period of time the second signal received from the dummy word line, thereby supplying said switch circuit with a resultant delayed signal.

16. A memory in accordance with claim 15 wherein said word line monitor circuit comprises a plurality of cascaded inverters, which are provided in such number that a total of said first and second predetermined periods of time exceeds a period of time in which said plurality of sense amplifier circuits appropriately operates in response to the potential difference.

17. A memory in accordance with claim 14 wherein each of said plurality of sense amplifier circuits comprises a plurality of sense amplifiers including MOS transistors of types having mutually complementary channel conductivity, said sense clock drive circuit producing mutually complementary signals to enable said MOS transistors.

18. A memory in accordance with claim 9 further comprising:
word line drive means responsive to a row address for driving a word line; and
a noise canceller control circuit for enabling the dummy word line.

19. A memory in accordance with claim 9 wherein each of said memory cells comprises an element having an MOS structure, each of said noise cancellers having substantially the same structure as that of said element.

20. A memory in accordance with claim 19 wherein said element comprises an NMOS transistor and an MOS capacitance, said MOS capacitance being connected to said NMOS transistor in cascade for storing information signals therein.

* * * * *